United States Patent [19]
Verheyen et al.

[11] Patent Number: 5,321,322
[45] Date of Patent: Jun. 14, 1994

[54] PROGRAMMABLE INTERCONNECT ARCHITECTURE WITHOUT ACTIVE DEVICES

[75] Inventors: Henry T. Verheyen, San Jose; Hung-Fai S. Law, Los Altos, both of Calif.

[73] Assignee: Aptix Corporation, San Jose, Calif.

[21] Appl. No.: 37,520

[22] Filed: Mar. 24, 1993

Related U.S. Application Data

[63] Continuation of Ser. No. 800,543, Nov. 27, 1991, abandoned.

[51] Int. Cl.$^5$ .................... H03K 19/173; H03K 3/26
[52] U.S. Cl. ............................ 307/465.1; 307/303.1; 307/202.1; 307/241; 257/530; 340/825.84; 365/102
[58] Field of Search ............... 307/202.1, 465, 465.1, 307/303.1, 482.1, 241, 242; 257/530; 364/716; 375/45; 365/63, 96, 100-102; 340/825.83, 825.84

[56] References Cited

U.S. PATENT DOCUMENTS

| | | | |
|---|---|---|---|
| 4,441,167 | 4/1984 | Principi | 365/94 |
| 4,458,297 | 7/1984 | Stopper et al. | 257/530 |
| 4,758,745 | 7/1988 | Elgamal et al. | 307/465 |
| 4,786,904 | 11/1988 | Graham, III et al. | 307/465 |
| 4,796,075 | 1/1989 | Whitten | 357/51 |
| 4,823,181 | 4/1989 | Mohsen et al. | 357/51 |
| 4,870,302 | 9/1989 | Freeman | 307/465 |
| 4,894,705 | 1/1990 | Kamuro | 357/71 |
| 4,899,205 | 2/1990 | Hamdy et al. | 257/530 |
| 4,908,692 | 3/1990 | Kikuchi et al. | 357/51 |
| 4,912,066 | 3/1990 | Wills | 437/173 |
| 4,937,475 | 6/1990 | Rhodes et al. | 307/465.1 |
| 4,947,020 | 8/1990 | Imamura et al. | 219/121.65 |
| 4,968,643 | 11/1990 | Mukai | 437/174 |
| 5,017,510 | 5/1991 | Welch et al. | 437/192 |
| 5,020,025 | 5/1991 | Nix et al. | 365/102 |
| 5,070,384 | 12/1991 | McCollum et al. | 357/51 |
| 5,148,391 | 9/1992 | Zagar | 365/102 |
| 5,200,652 | 4/1993 | Lee | 307/465 |

FOREIGN PATENT DOCUMENTS 0416903 3/1991 European Pat. Off. ... H01L 21/320

Primary Examiner—Edward P. Westin
Assistant Examiner—Richard Roseen
Attorney, Agent, or Firm—D'Alessandro, Frazzini & Ritchie

[57] ABSTRACT

An integrated, user-programmable interconnect architecture, includes a plurality of input/output pads arranged in a matrix of rows and columns, each of the input/output pads being connected to a first one of its row neighbors and a first one of its column neighbors by a two-state programmable interconnect element in series with a first three-state programmable interconnect element having first programming characteristics. A plurality of first conductors is generally disposed in a direction parallel to the rows, each of the rows having at least one of the first conductors connected through ones of the first three-state programmable interconnect elements to selected ones of the input/output pads associated therewith, at least one of the first conductors segmented by at least one of the two-state programmable interconnect elements. A plurality of second conductors is generally disposed in a direction parallel to the columns, each of the columns having at least one of the second conductors connected through ones of the first three-state programmable interconnect elements to selected ones of the input/output pads associated therewith. The second conductors form intersections with the first conductors, and at least one of the second conductors is segmented by at least one two-state programmable interconnect element located at a selected position along its length. Ones of the first conductors and ones of the second conductors are connected together at selected intersections by ones of second three-state programmable interconnect elements having second programming characteristics.

13 Claims, 7 Drawing Sheets

PROGRAMMABLE INTERCONNECT ARCHITECTURE WITHOUT ACTIVE DEVICES

This is a continuation of co-pending patent application Ser. No. 07/800,543 filed Nov. 27, 1991, now abandoned.

BACKGROUND OF THE INVENTION

1. Field Of The Invention

The present invention relates to user-programmable interconnect architectures. More particularly, the present invention relates to user-programmable interconnect architectures which do not employ active devices.

2. The Prior Art

Recent activity in integrated circuit and other microcircuit applications has focussed on user-programmable circuits which employ user-programmable interconnect architectures. Such architectures have become useful as circuit designers seek circuit design solutions which provide them with faster turn-around times for circuits under development.

There are numerous examples of user-programmable interconnect architectures known in the prior art. These prior art architectures utilize a mixture of active switching components, such as transistors, and passive components, such as fuse elements and antifuse elements. One example of a user-programmable interconnect architecture which relies completely on active transistor switching devices as both interconnect elements and the means to program the interconnect elements is disclosed in U.S. Pat. No. 4,870,302 to Freeman. An example of a user-programmable interconnect architecture which employs antifuse devices as the interconnect elements and also employs active semiconductor components to program the interconnect elements is disclosed in U.S. Pat. No. 4,758,745 to El Gamal et al.

User-programmable interconnect architectures have been used to provide field programmable logic arrays (FPLAs), field programmable gate arrays (FPGAs), as well as to provide memory redundancy and other user configurable circuit functions. The number and variety of applications for user-programmable interconnect architectures for interconnecting semiconductor circuits on integrated circuits is rapidly growing.

Applications for user-programmable interconnect architecture also include interconnection matrices, such as cross-point switches, which essentially comprise a large matrix of orthogonally disposed conductor segments which may be programmably interconnected by a user to form a customized interconnect pattern. Such structures have an increasing number of different uses.

In certain applications, it is sometimes advantageous to fabricate the user-programmable interconnect architecture on conductive substrates which have been covered by a layer of insulating material or on substrates fabricated from insulating materials. Fabrication of integrated active transistor switching devices capable of switching high voltages and high currents for use in programming the interconnect elements is more difficult when such substrates are employed. The difficulty to form active high-voltage, high-current transistor switching devices for use in programming the interconnections has heretofore presented a significant problem in the design of large-scale, dense interconnection matrices employing non-semiconductor substrates.

It is an object of the present invention to provide a user-programmable interconnect architecture which does not employ or require active semiconductor devices integrated with the interconnect architecture for any purpose.

It is a further object of the present invention to provide a user-programmable interconnect architecture which may be fabricated on a substrate which is formed from a conductive or non-conductive material.

Yet another object of the present invention is to provide an integrated, user-programmable interconnect architecture which may be completely programmed by the application of voltages and currents to externally-accessible conductor nodes.

These, and other objects of the present invention will become apparent to those of ordinary skill in the art from an examination of the following specification and accompanying drawing figures.

BRIEF DESCRIPTION OF THE INVENTION

An integrated, user-programmable interconnect architecture, includes a plurality of input/output pads arranged in a matrix of rows and columns, each of the input/output pads being connected to a first one of its row neighbors and a first one of its column neighbors by a two-state programmable interconnect element in series with a first three-state programmable interconnect element having first programming characteristics. A plurality of first conductors is generally disposed in a direction parallel to the rows, each of the rows having at least one of the first conductors connected through ones of the first three-state programmable interconnect elements to selected ones of the input/output pads associated therewith, at least one of the first conductors segmented by at least one of the two-state programmable interconnect elements. A plurality of second conductors is generally disposed in a direction parallel to the columns, each of the columns having at least one of the second conductors connected through ones of the first three-state programmable interconnect elements to selected ones of the input/output pads associated therewith. The second conductors form intersections with the first conductors, and at least one of the second conductors is segmented by at least one two-state programmable interconnect element located at a selected position along its length. Ones of the first conductors and ones of the second conductors are connected together at selected intersections by ones of second three-state programmable interconnect elements having second programming characteristics.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The user-programmable interconnect architecture of the present invention employs two types of user-programmable interconnect elements. Both types are passive elements, i.e., they do not employ active semiconductor devices.

Figure 1:
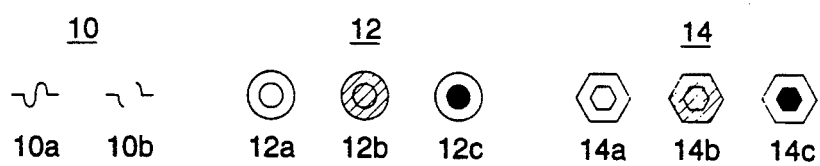
FIG. 1 is a diagram showing the schematic symbols which are used herein to indicate the various programmable interconnect elements utilized in a presently-preferred embodiment of the invention and their programmed and unprogrammed states.

The first user-programmable interconnect element employed in the architecture of the present invention is a two-state programmable interconnect element 10, a passive two-terminal device, which, in its unprogrammed state, is a short circuit. The symbol 10a in FIG. 1 will be used herein to indicate this two-state programmable interconnect element in its unprogrammed state. In its programmed state, the two-state programmable interconnect element is an open circuit. The symbol 10b in FIG. 1 will be used to indicate this two-state programmable interconnect element in its programmed state. In order to program the two-state programmable interconnect element of the present invention, a programming current $I_{open-1}$ is passed through it.

According to a presently preferred embodiment, two-state programmable interconnect element 10 may comprise a fuse structure comprising molybdenum, nickel, titanium, titanium-tungsten, chromium, aluminum, copper or other materials.

The second type of user-programmable interconnect element employed in the user-programmable interconnect architecture of the present invention is a three-state programmable interconnect element which is electrically equivalent to an antifuse element in series with a fuse element. According to a presently preferred embodiment of the invention, two kinds of these three-state programmable interconnect elements are provided. A first three-state programmable interconnect element is shown at reference numeral 12. First three-state programmable interconnect 12 is a two-terminal device which comprises an antifuse element in series with a fuse element. In its unprogrammed state, the first three-state programmable interconnect element 12 is an open circuit, and will be indicated herein by the symbol 12a of FIG. 1.

First three-state programmable interconnect 12 has two programmed states. A first programming step places it in its first programmed state and a second programming step places it in its second programmed state. In its first programmed state, first three-state programmable interconnect element 12 is a short circuit and will be indicated herein by the symbol 12b of FIG. 1. In its second programmed state, first three-state programmable interconnect element 12 is again an open circuit and will be indicated herein by the symbol shown at reference numeral 12c of FIG. 1.

The first programming step required to place first three-state programmable interconnect element 12 in its first programmed state 12b comprises the step of placing a programming voltage across its two terminals. This action programs the antifuse portion of first three-state programmable interconnect element 12.

The second programming step required to place first three-state programmable interconnect element 12 in its second programmed state 12c comprises the step of passing a programming current $I_{open-2}$ through it. This action programs the fuse portion of first three-state programmable interconnect element 12. According to a presently preferred embodiment of the invention, $I_{open-1}$ is equal to $I_{open-2}$ and will be referred to herein as $I_{B-open}$. Those of ordinary skill in the art will recognize that these two programming currents do not have to be equal with the result, however, that programming the architecture of the present invention becomes more difficult.

The other three-state programmable interconnect element utilized in a presently preferred embodiment of the invention is a second three-state programmable interconnect element shown at reference numeral 14. Like first three-state programmable interconnect element 12, second three-state programmable interconnect element 14 is a two-terminal device which comprises an antifuse element in series with a fuse element. In its unprogrammed state, the second three-state programmable interconnect element 14 is an open circuit, and will be indicated herein by the symbol 14a of FIG. 1.

Second three-state programmable interconnect element 14 also has two programmed states. A first programming step places it in its first programmed state and a second programming step places it in its second programmed state. In its first programmed state, second three-state programmable interconnect element 14 is a short circuit and will be indicated herein by the symbol 14b of FIG. 1. In its second programmed state, second three-state programmable interconnect element 14 is again an open circuit and will be indicated herein by the symbol shown at reference numeral 14c of FIG. 1.

The first programming step required to place second three-state programmable interconnect element 14 in its first programmed state 14b comprises the step of placing the programming voltage across its two terminals. This action programs the antifuse portion of second three-state programmable interconnect element 14.

The second programming step required to place second three-state programmable interconnect element 14 in its second programmed state 14c comprises the step of passing a programming current $I_{b\text{-}open}$ through it. This action programs the fuse portion of second three-state programmable interconnect element 14.

As presently preferred, first three-state programmable interconnect element 12 and second three-state programmable interconnect element 14 may comprise structures such as that described in co-pending application Ser. No. 07/774,531, filed Oct. 8, 1991, entitled USER-PROGRAMMABLE INTERCONNECT ELEMENT FOR INTEGRATED CIRCUITS, expressly incorporated herein by reference, although those of ordinary skill in the art will be readily able to fabricate a functionally-equivalent structure employing a series combination of known fuse and antifuse structures from a knowledge of its characteristics as set forth herein.

According to a presently preferred embodiment of the present invention, the antifuse portions of the first and second programmable interconnect elements 12 and 14 are both designed to program at a programming voltage $V_{pp}$, which will convert them from an unprogrammed open-circuit state to a first programmed short-circuit state. As presently preferred, these elements are fabricated such that they will not program at a voltage of $V_{pp}/2$ or less. The fuse portion of first programmable interconnect element 12 may be programmed to convert it from its first programmed short-circuit state to its second programmed open-circuit state by passing a current through it with a magnitude of $I_{B\text{-}open}$. A Current level of $I_{B\text{-}sustain}$ may be defined for first programmable interconnect element 12 and is defined as a current level below which the conductive state of first programmable interconnect element 12 will not be affected, i.e., it will not program to its second open-circuit programmed state. This value is always less than $I_{B\text{-}open}$. Current levels between $I_{B\text{-}sustain}$ and $I_{B\text{-}open}$ may permanently damage the element.

Similarly, the fuse portion of second programmable interconnect element 14 may be programmed to convert it from its first programmed short-circuit state to its second programmed open-circuit state by passing a current through it with a magnitude of $I_{b\text{-}open}$. A current level of $I_{b\text{-}sustain}$ may be defined for second programmable interconnect element 14 and is defined as a current level below which second programmable interconnect element 14 will not program to its second programmed state. This value is always less than $I_{b\text{-}open}$. Current levels between $I_{b\text{-}sustain}$ and $I_{b\text{-}open}$ may permanently damage the element.

The programming current levels for first and second programmable interconnect elements 12 and 14 are related by the following equation:

$$I_{b\text{-}open} \leq I_{B\text{-}sustain} \quad [1]$$

From equation [1], it may be seen that a single first programmable interconnect element 12 in its first programmed short-circuit state, may be employed in a programming path through which a second programmable interconnect element 14 is to be programmed from its first programmed short-circuit state to its second programmed open-circuit state without programming first programmable interconnect element 12 to its second programmed open-circuit state.

According to a presently preferred embodiment of the invention, the fuse portion of programmable interconnect element 10 is designed such that it may be programmed to convert it from its first programmed short-circuit state to its second programmed open-circuit state by passing a current through it with a magnitude of $I_{B\text{-}open}$. A current level of $I_{B\text{-}sustain}$ may be defined for programmable interconnect element 10 and is defined as a current level below which the unprogrammed conductive state of two-state programmable interconnect element 10 will not be affected, i.e., it will not program to its open-circuit programmed state.

According to the present invention, the currents $I_{b\text{-}open}$ and $I_{b\text{-}sustain}$ for second three-state programmable interconnect element 14 are related as follows:

$$I_{b\text{-}sustain} = \alpha \cdot I_{b\text{-}open}; \ (0 < \alpha < 1) \quad [2]$$

Similarly, the currents $I_{B\text{-}open}$ and $I_{B\text{-}sustain}$ for first three-state programmable interconnect element 12 are related as follows:

$$I_{B\text{-}sustain} = \beta \cdot I_{B\text{-}open}; \ (0 < \beta 1) \quad [3]$$

The variables $\alpha$ and $\beta$ are set between zero and one, and they may be equal to each other. They represent the amount of "stress," i.e., the level of current which may be experienced by three-state programmable interconnect elements 12 and 14, respectively, for a set period of time without undergoing permanent physical changes. The stress level is given as a percentage of the nominal programming current and is bounded between zero (no stress) and 1 (the programming current). Typical stress levels for programmable elements used in the present invention are between about 25–50% of nominal programming current. These stress levels depend on selection of the fuse material and surrounding dielectric and other neighboring structures.

As will be appreciated by those of ordinary skill in the art, the relative values of $I_{B\text{-}open}$, $I_{b\text{-}open}$, $I_{open\text{-}1}$ and $I_{open\text{-}2}$ may be easily accomplished by appropriately dimensioning the fuse portion of the first and second three-state programmable interconnect elements 12 and 14 and the two-state programmable element 10 accordingly.

By employing user-programmable elements as described above, a user-programmable interconnect matrix of substantial size and complexity may be realized. The use of the several different elements allows the programming flexibility necessary to implement a complex user-programmable interconnect architecture.

The use of programmable interconnect elements 10, 12, and 14 will be illustrated with reference to FIGS. 2a–2c, 3a–3b, 4, 5a–5b.

Figure 2A:
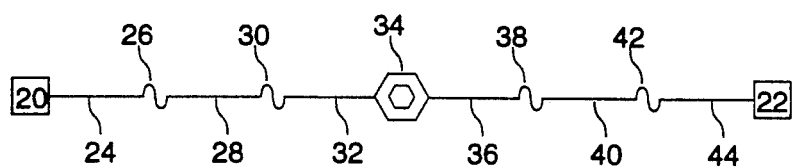
FIGS. 2a–2c are schematic diagrams showing the programming of a second three-state programmable interconnect element according to the present invention.
Figure 2B:
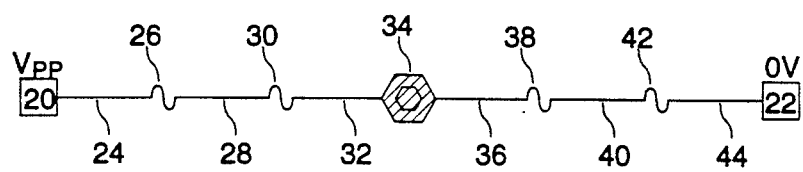
Figure 2C:
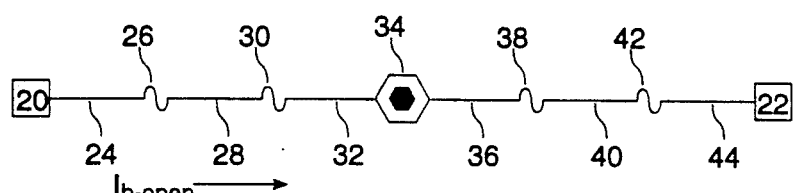

Referring first to FIGS. 2a–2c, a user-programmable interconnect array according to the present invention will include a plurality of user-accessible pads which will be used as the terminations for the interconnect matrix and will also be used to program the user-programmable interconnect elements located in the matrix. FIG. 2a depicts a plurality of interconnect conductors and user-programmable interconnect elements connected between user-accessible pads 20 and 22.

More particularly, as shown in FIG. 2a, a series circuit exists between user-accessible pads 20 and 22 comprising conductor 24 two-state programmable interconnect element 26, conductor 28, two-state programmable interconnect element 30, conductor 32, second three-state programmable interconnect element 34, conductor 36, two-state programmable interconnect element 38, conductor 40, two-state programmable interconnect element 42, and conductor 44. Second three-state programmable interconnect element 34 is initially in its unprogrammed state, which means that it is an open circuit. Two-state programmable interconnect elements 26, 30, 38 and 42 are initially short circuits in their unprogrammed state.

To program second three-state programmable interconnect element 34 into its first programmed short-circuit state, a programming voltage $V_{pp}$ is placed across user-accessible pads 20 and 22. FIG. 2b depicts second three-state programmable interconnect element 34 in its first programmed state.

Once second three-state programmable interconnect element 34 is in its first programmed state, it may be further programmed into its second programmed open-circuit state by passing a programming current $I_{b\text{-}open}$ through it between user-accessible pads 20 and 22. Those of ordinary skill in the art will observe that, because $I_{b\text{-}open} \leq I_{B\text{-}sustain}$ (Equation [1]) second three-state programmable interconnect element 34 may be programmed to its second programmed open-circuit state without stressing or unintentionally programming two-state programmable interconnect elements 26, 30, 38, and 42. FIG. 2c depicts second three-state programmable interconnect element 34 in its second programmed state. Because two-state programmable interconnect elements and first three-state programmable elements according to the present invention are designed for $I_{B\text{-}open}$ and $I_{B\text{-}sustain}$, those of ordinary skill in the art will recognize that the same procedure may be employed to program second three-state programmable element 34 if the programming path includes one or more first three-state programmable elements, one or more two-state programmable elements, or both.

According to the present invention, two-state and three-state programmable interconnect elements may be programmed using more than two user-accessible pads. There are two general cases of programming of two-state programmable interconnect elements. The first case is the programming of a two-state programmable interconnect element which is directly connected to a pad by a conductor, and the second case is the programming of a two-state programmable interconnect element which is not directly connected to a pad by a conductor.

Figure 3A:
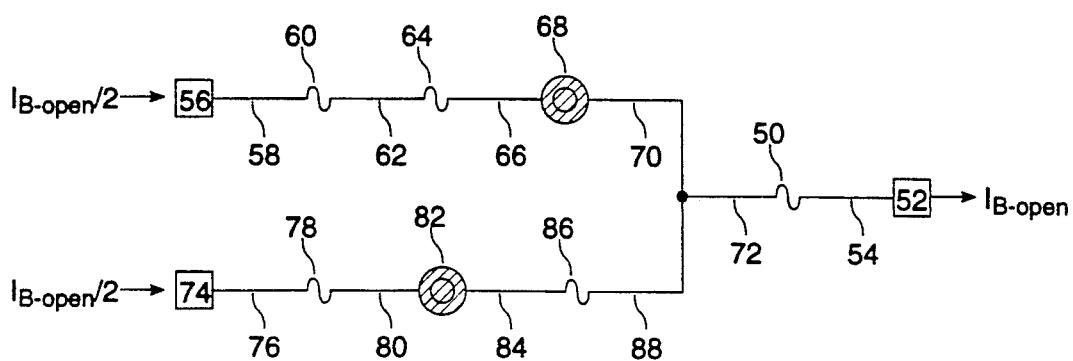
FIG. 3a is a schematic diagram illustrating the procedure for programming a two-state programmable interconnect element directly connected to a pad in a user-programmable interconnect architecture according to the present invention.
Figure 3B:
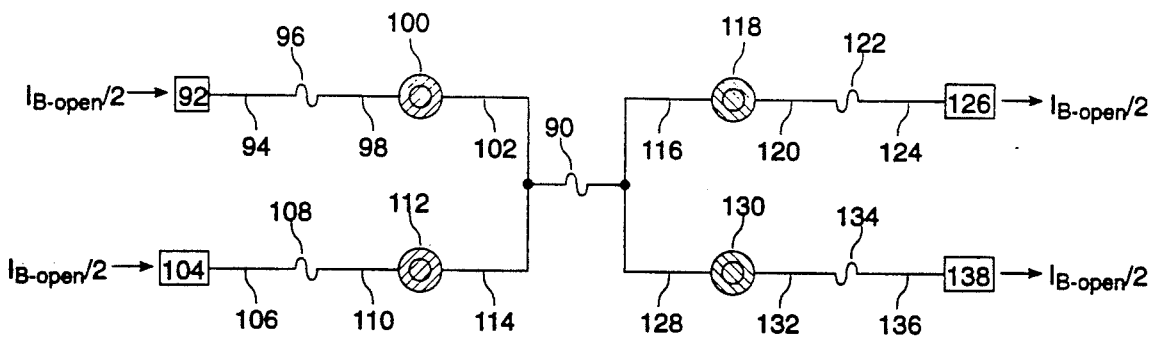
FIG. 3b is a schematic diagram illustrating the procedure for programming a two-state programmable interconnect element remote from a pad in a user-programmable interconnect architecture according to the present invention.

FIGS. 3a and 3b, respectively illustrate both these two-state programmable interconnect programming cases. Referring first to FIG. 3a, two-state programmable interconnect element 50 is shown directly connected to pad 52 through conductor 54. It may be programmed to its open circuit state by passing a programming current having a magnitude of $I_{B\text{-}open}$ through it in a manner which avoids programming other two-state programmable interconnects in the series circuit containing it. By passing a current having a magnitude of $I_{B\text{-}sustain}$ (which is equal to $I_{B\text{-}open}/2$ for the circuit of FIGS. 3a and 3b for $\beta=0.5$ in equation 3) between pad 56, conductor 58, two-state programmable interconnect element 60, conductor 62, two-state programmable interconnect element 64, conductor 66, first three-state programmable interconnect element 68 (which has been previously programmed to its first short circuit state), and conductor 70, connected to conductor 72, which is directly connected to two-state programmable interconnect element 50, while simultaneously passing a current of magnitude $I_{B\text{-}open}/2$ between pad 74, conductor 76, two-state programmable interconnect element 78, conductor 80, first three-state programmable interconnect element 82 (which has been previously programmed to its first short circuit state), conductor 84, two-state programmable interconnect element 86 and conductor 88, which is also connected to conductor 72, two-state programmable interconnect element 50 may be programmed. By employing this dual programming path and these programming currents, it is assured that two-state programmable interconnect element 50 will be programmed without 7. inadvertently programming two-state programmable interconnect elements 60, 64, 78, and 86, through which only $I_{B\text{-}open}/2$ will flow. In addition, because the fuse element portion of first three-state programmable interconnect elements 68 and 82 require a programming current of $I_{B\text{-}open}$, but are not affected by any current level equal to or less than $I_{B\text{-}sustain}$ ($I_{B\text{-}open}/2$) they will not be inadvertently programmed to their second states.

Referring now to FIG. 3b, the programming method according to the present invention is shown for programming a two-state programmable interconnect element which is not directly connected to one of the pads through a conductor. Two-state programmable interconnect element 90 is located internally in the interconnect matrix and may be accessed by several parallel current paths. As in the example given in FIG. 3a, the objective is to supply sufficient current to two-state programmable interconnect element 90 to program it without inadvertently programming other two-state programmable interconnect elements and first three-state programmable interconnect elements in the programming current paths.

In the present example, a programming current of $I_{B\text{-}open}/2$ is passed from pad 92, through conductor 94, two-state programmable interconnect element 96, conductor 98, first three-state programmable interconnect element 100 (which has been previously programmed to its first short circuit state), and conductor 102 to two-state programmable interconnect element 90. Another programming current $I_{B\text{-}open}/2$ is passed from pad 104, through conductor 106, two-state programmable interconnect element 108, conductor 110, first three-state programmable interconnect element 112 (which has been previously programmed to its first short circuit state), and conductor 114 to two-state programmable interconnect element 90. The total current passing through two-state programmable interconnect element 90 is $I_{B\text{-}open}$.

This current $I_{B\text{-}open}$ must be split into several components to avoid programming the two-state and first three-state programmable interconnect elements in the return path. Thus, a current of $I_{B\text{-}open}/2$ passes through conductor 116, first three-state programmable interconnect element 118 (which has been previously programmed to its first short circuit state), conductor 120, two-state programmable interconnect element 122, and conductor 124 to pad 126. A similar current $I_{B\text{-}open}/2$ passes through conductor 128, first three-state programmable interconnect element 130 (which has been previously programmed to its first short circuit state), conductor 132, two-state programmable interconnect element 134, and conductor 136 to pad 8. Again, because two-state programmable interconnect elements 122 and 134, and the fuse element portion of three-state programmable interconnect elements 100, 112, 118, and 130 require a programming current of $I_{B\text{-}open}$, they will not be inadvertently programmed to their open-circuit states.

Those of ordinary skill in the art will recognize that, because only two programming paths are utilized in the programming schemes illustrated in FIGS. 3a and 3b, it may not be possible for second three-state programmable interconnect elements 14 to be present in these paths if $I_{B\text{-}open}/2$ is equal to or larger than $I_{b\text{-}sustain}$. In addition, such persons will recognize that since current $I_{B\text{-}open}$ is required to program any first three-state programmable interconnect element, such current cannot be provided through any single direct path since all paths are limited to $I_{B\text{-}sustain}$ or $I_{b\text{-}sustain}$, depending on whether any second three-state programmable interconnect elements appear in the path.

In a more general situation, in order to obtain a programming current $I_{B\text{-}open}$, a summation of currents from a number of paths which connect to the node connected to the element to be programmed. If it is assumed that p paths are available which contain only two-state and first three-state programmable interconnect elements and which may thus supply $I_{B\text{-}sustain}$, and further that q paths are available which contain second three-state programmable interconnect elements and may contain two-state and first three-state programmable interconnect elements, and may thus supply only $I_{b\text{-}sustain}$, the total programming current IB-open may be expressed:

$$I_{B\text{-}oepn} \geq p \cdot I_{B\text{-}sustain} + q \cdot I_{b\text{-}sustain} \quad [4]$$

Using equation [2] to derive equation [5]:

$$I_{B\text{-}open} = p \cdot I_{B\text{-}sustain} + q \cdot \alpha \cdot I_{b\text{-}open} \quad [5]$$

and the minimum case of $I_{b\text{-}open} = I_{B\text{-}sustain}$ from equation [1] to derive:

$$I_{B\text{-}open} \geq p \cdot I_{B\text{-}sustain} + q \cdot \alpha \cdot I_{B\text{-}sustain} \quad [6]$$

and:

$$I_{B\text{-}open} \geq (p + q \cdot \alpha) \cdot I_{B\text{-}sustain} \quad [7]$$

Equation [3] may be used to obtain:

$$I_{B\text{-}open} \geq (p + q \cdot \alpha) \cdot \beta \cdot I_{B\text{-}open} \quad [8]$$

which may be rearranged as:

$$1 \geq (p + q \sqrt{a}) \cdot \beta \quad [9]$$

Then, if $p \geq 1$, then:

$$1 \geq (1 + q \cdot a) \cdot \beta \quad [10]$$

which may be rearranged as:

$$q \geq a^{-1}(\beta^{-1} - 1) \quad [11]$$

It is presently preferred that $p = 1$ in order to allow for the programming of a last second three-state programmable interconnect element from its first to its second programmed state. Based on the stress levels $I_{b\text{-}sustain}$ and $II_{B\text{-}sustain}$, a minimum parallel configuration of interconnect elements 10, 12, and 14 for $\alpha = \beta = 0.25$ is q=12. Similarly, for $\alpha = \beta = 0.5$, q = 12.

Figure 4:
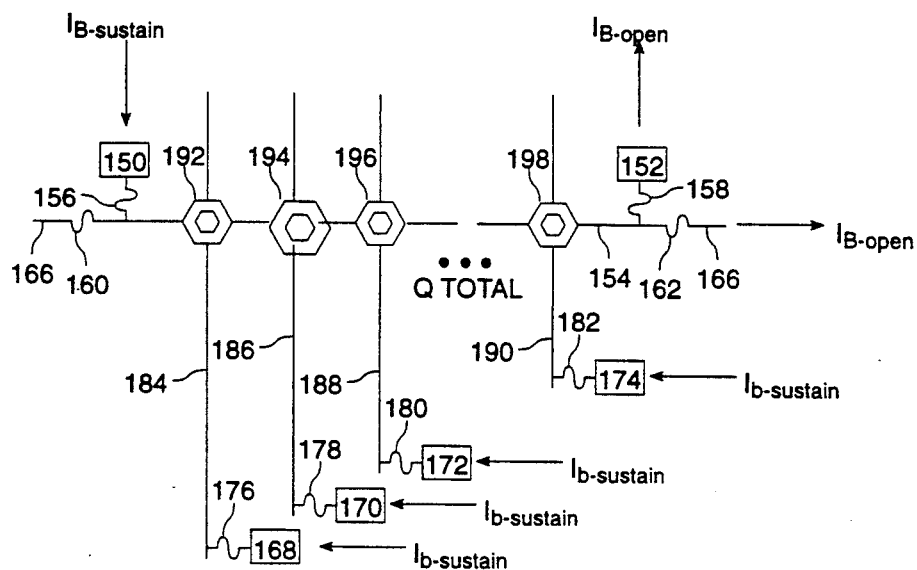
FIG. 4 is a schematic diagram of a portion of an interconnect array according to the present invention illustrating programming of two-state or first three-state programmable interconnect elements through current sharing by a number of second three-state elements.

Referring now to FIG. 4, a portion of an interconnect array according to the present invention, the programming of a two-state element through current sharing by a number of second three-state elements may be understood by example. It is desired to program a two-state programmable interconnect element from its unprogrammed conductive state to its programmed non-conductive state. From the discussion herein, those of ordinary skill in the art will recognize that the disclosure herein relates also to the programming of a second three-state programmable interconnect element from its conductive second programmed state to a non-conductive third programmed state.

In FIG. 4, user-accessible pads 150 and 152 are shown connected to conductor 154 through two-state programmable I8 interconnect elements 156 and 158. Two-state programmable interconnect elements 160 and 162 are shown connected between conductor 154 and conductors 164 and 166, respectively for use in segmenting the connections along those conductors. User-accessible pads 168, 170, 172, and 174 are connected through two-state programmable interconnect elements 176, 178, 180, and 182 to conductors 184, 186, 188, and 190, respectively. Conductors 184, 186, 188, and 190 are connected to conductor 154 through second three-state programmable interconnect elements 192, 194, 196, and 198, respectively.

FIG. 4 illustrates how current sharing may be employed to generate the required current $I_{B\text{-}open}$, which may be pulled out through user-accessible pad 152 to program two-state programmable interconnect element 158. The current flowing through each of second three-state programmable interconnect elements 192, 194, 196, and 198 is limited to the value $I_{b\text{-}sustain}$. The minimum number (q) of current paths of magnitude $I_{b\text{-}sustain}$ may be determined as disclosed herein.

Although FIG. 4 illustrates the programming of two-state 12 programmable interconnect elements, those of ordinary skill in the art will recognize that the disclosure herein applies also to programming of first three-state programmable interconnect elements from their first conductive programmed state to their second non-conductive programmed state.

If it is desired to program two-state programmable interconnect element 162, the current $I_{B\text{-}open}$ through two-state programmable interconnect element 162 to conductor 166 may be pulled out through a plurality current paths each including second three-state programmable elements coupled to user-accessible pads through conductors in an arrangement similar to elements 176, 178, 180, and 182, conductors 184, 186, 188, and 190, respectively, and pads 168, 170, 172, and 174 in FIG. 4.

Figure 5A:
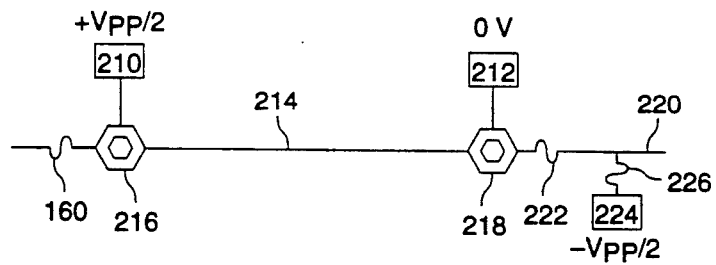
FIGS. 5a and 5b are schematic diagrams illustrating the programming of first three-state programmable interconnect elements according to the present invention.
Figure 5B:
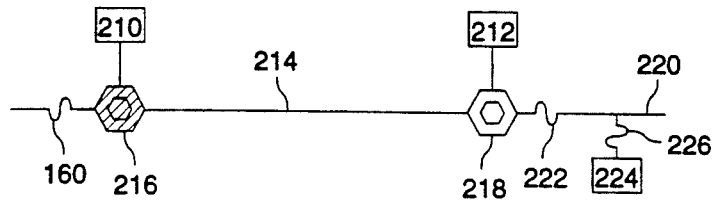

Referring now to FIGS. 5a and 5b, techniques for programming three-state programmable interconnect elements from their first unprogrammed non-conductive state their first conductive programmed state may be understood. In FIG. 5a user-accessible pads 210 and 212 are connected to conductor 214 via first three-state programmable interconnect elements 216 and 218. Conductor 214 is connected to conductor 220 through two-state programmable interconnect element 222. User-accessible pad 224 is connected to conductor 220 through two-state programmable interconnect element 226.

Initially, as shown in FIG. 5a, user accessible pads 210 and 212 are not connected to conductor 214 and user-accessible pad 224 is connected to conductor 214 through two-state programmable interconnect element 226, conductor 220 and two-state programmable interconnect element 222. By applying a programming voltage $V_{pp}$ across first three-state programmable interconnect element using pads 210 and 224, a connection may be made from user-accessible pad 210 to conductor 214. Those of ordinary skill in the art will recognize that by applying a voltage potential of $+V_{pp}/2$ to user-accessible pad 210, applying a voltage potential of $-V_{pp}/2$ to user accessible pad 224, and applying a voltage potential of zero to user-accessible pad 212, first three-state programmable interconnect element 216 will be programmed by a voltage of $V_{pp}$ placed across it, but that first three-state programmable interconnect element 218 will remain unprogrammed because a voltage of only $V_{pp}/2$ placed across it as shown in FIG. 5b.

Those of ordinary skill in the art will recognize that first three-state programmable interconnect element 218 may next be programmed by placing a voltage potential of $+V_{pp}/2$ at user-accessible pad 212 while lowering the potential at user-accessible pad 210 to zero volts while maintaining a potential of $-V_{pp}/2$ on user-accessible pad 224.

The use of the above-disclosed user-programmable elements and programming techniques illustrated in FIGS. 2a-2c, 3a-3b, 4, and 5a-5b allow the design of a dense user-programmable interconnect architecture which may be completely programmed from circuit nodes available to the user via external connections from the substrate containing the matrix without need to employ active switching devices, such as transistors, and without the need to employ additional circuitry to provide addressing or other selection of the programmable interconnect elements during the programming cycle. The architecture of a user programmable interconnect matrix according to the present invention will now be disclosed in detail.

The architecture of a user-programmable interconnect matrix according to the present invention is based upon a matrix of input/output pads, internal conductors, and two-state and three-state programmable interconnect elements. The matrix may be of an arbitrary size. For example, a 34×34 matrix will have 1,256 pads. Such a matrix would preferably assure a square layout, although those of ordinary skill in the art will realize that other shapes are possible. Such other shapes are intended to fall within the scope of the present invention.

Figure 6:
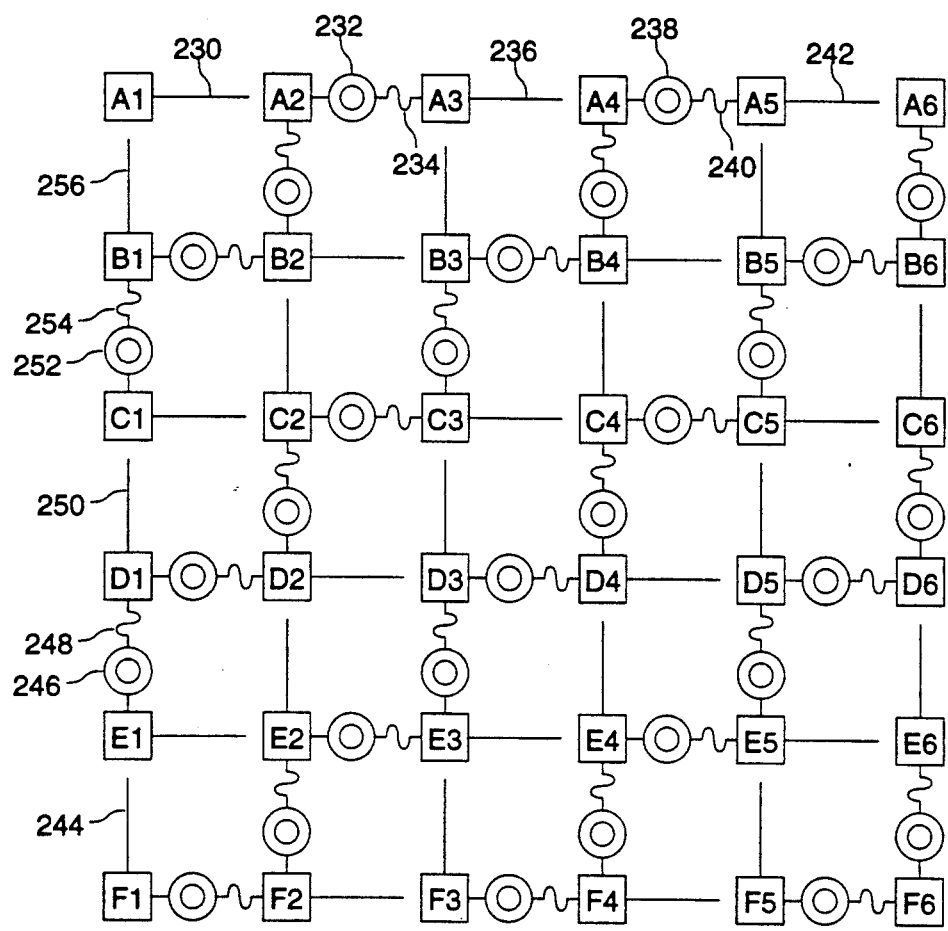
FIG. 6 is a schematic diagram illustrating a basic layout of a portion of a user-programmable interconnect matrix according to the present invention showing a plurality of pads and their associated pad stub conductors, and a network of two-state and first three state programmable interconnect elements.

Referring now to FIG. 6, a schematic diagram shows a basic layout of a portion of a user-programmable interconnect matrix according to the present invention. The matrix of FIG. 6 is illustrative only and shows a 6×6 matrix. Pads A1-A6; B1-B6; C1-C6; D1-D6; E1-E6; and F1-F6 are shown as small squares disposed in a square matrix layout. For convenience, the reference numeral for each pad is shown inside the small square which defines it.

The pad matrix of FIG. 6 is interconnected by a network of conductive stubs connected to various one of the pads in a pattern comprising combinations of two-state and first three-state user-programmable interconnect elements. As presently preferred, the patterns in both the horizonral and vertical directions are similar, but from the disclosure herein, those of ordinary skill in the art will be able to compose other patterns.

In the horizontal direction, from left to right, the presently preferred pattern comprises a horizontal pad stub conductor connected to a first pad which extends towards but does not contact a second adjacent pad. The second pad is connected to a third adjacent pad by a first three-state programmable interconnect element in series with a two-state programmable interconnect element. The third pad becomes a first pad for a repetition of the horizontal pattern.

Thus, from FIG. 6, it may be seen that horizontal pad stub conductor 230 extends to the right of pad A1 but does not make contact with pad A2. Pad A2 is connected to pad A3 by first three-state programmable interconnect element 232 in series with two-state programmable interconnect element 234. Horizontal pad stub conductor 236 extends to the right of pad A3 but does not make contact with pad A4. Pad A4 is connected to pad A5 by first three-state programmable interconnect element 238 in series with two-state programmable interconnect element 240. Horizontal pad stub conductor 242 extends to the right of pad A5 but does not make contact with pad A6. The connections in the second row among pads B1-B6 are similar, but are staggered one pad over from the connections of pads A1-A6. This pattern repeats in the rows containing pads C1-C6, D1-D6, E1-E6, and F1-F6.

The pattern in the vertical direction is similar. From bottom to top, the presently preferred pattern comprises a first pad connected to a next second vertically adjacent pad by a first three-state programmable interconnect element in series with a two-state programmable interconnect element and extending a vertical pad stub conductor towards a third adjacent pad without connecting the vertical pad stub conductor to the third pad. The third pad becomes a first pad for a repetition of the vertical pattern.

Thus, vertical pad stub conductor 244 extends above pad F1 but does not make contact with pad E1. Pad E1 is connected to pad D1 by first three-state programmable interconnect element 246 in series with two-state programmable interconnect element 248. Vertical pad stub conductor 250 extends above pad D1 but does not make contact with pad C1. Pad C1 is connected to pad B1 by first three-state programmable interconnect element 252 in series with two-state programmable interconnect element 254. Vertical pad stub conductor 256 extends above pad B1 but does not make contact with pad A1. The connections in the second column among pads F2-A2 are similar, but are staggered one pad over from the connections of pads F1-A1. This pattern repeats in the columns containing pads F3-A3, F4-A4, F5-A5, and F6-A6.

The horizontal and vertical pad stub qonductors are used to make connections between the pads and a matrix of horizontal and vertical wiring tracks which are superimposed thereon and which form the heart of the interconnect matrix of the present invention. The arrangement of these horizontal and vertical wiring tracks and their relationship to the pads and the pad stub conductors will now be disclosed.

Figure 7:
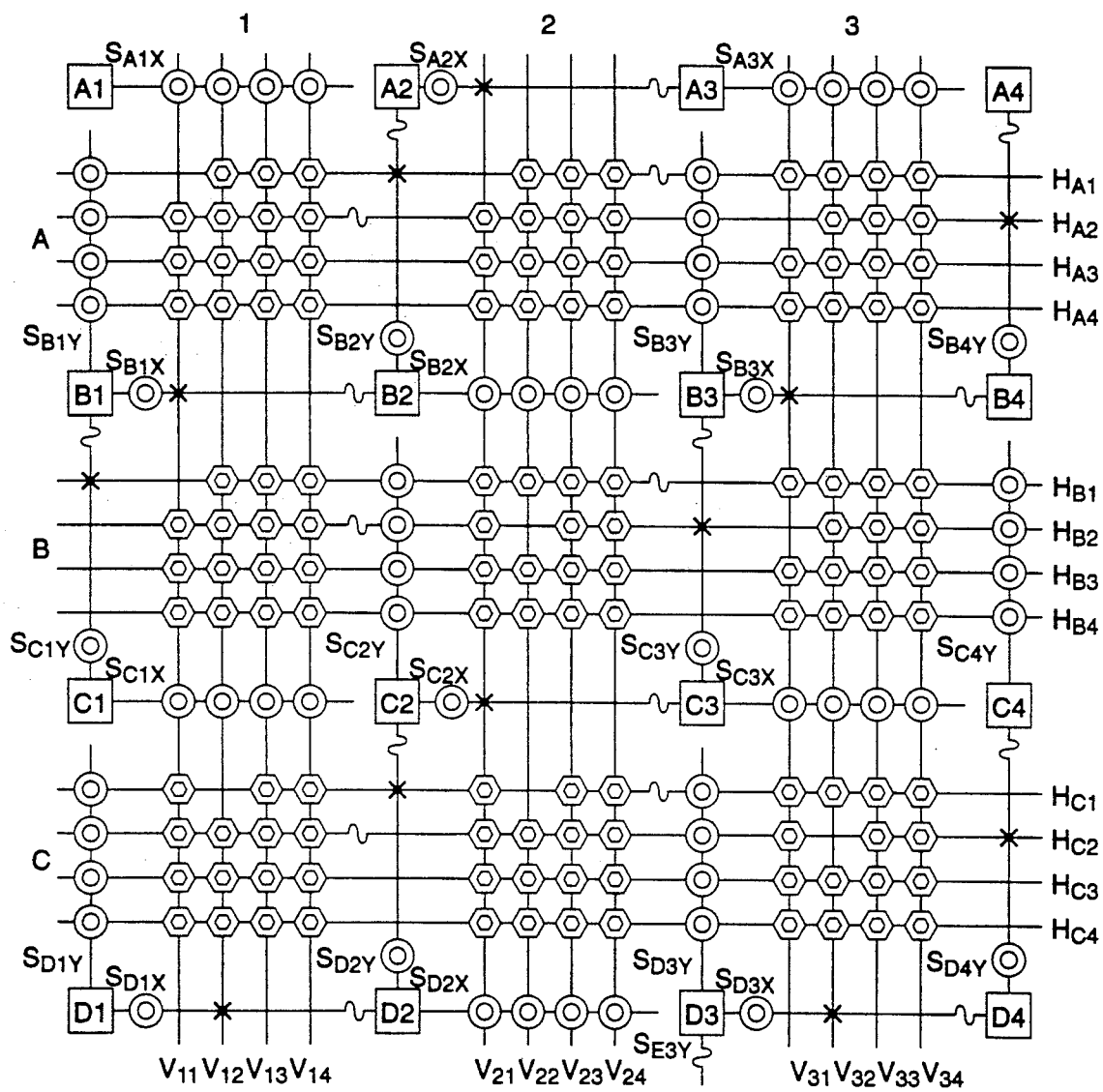
FIG. 7 is a schematic diagram of a portion of the matrix of FIG. 6 further showing a plurality of horizontal and vertical wiring tracks, second three-state programmable interconnect elements and connection vias.

Referring to FIG. 7, a schematic diagram of a portion of the matrix of FIG. 6 comprising rows A-C and columns 1-3 (although portions of row D and column 4 are shown) is depicted to illustrate the interconnect wiring tracks of architecture of the present invention. A plurality of pads A1-A4, B1-B4, C1-C4, D1-D4, and their associated stub conductors, $S_{A1X}$-$S_{A3X}$, $S_{B1X}$-$S_{B3X}$, $S_{B1Y}$-$S_{B4Y}$, $S_{C1X}$-$S_{C3X}$, $S_{C1Y}$-$S_{C4Y}$, $S_{D1X}$-$S_{D3X}$ and $S_{D1Y}$-$S_{D4Y}$ are shown. A plurality of horizontal wiring tracks $H_{A1}$-$H_{A4}$, $H_{B1}$-$H_{B4}$, and $H_{C1}$-$H_{C4}$ are associated with rows A, B and C, respectively. Similarly, a plurality of vertical wiring tracks $V_{11}$-$V_{14}$, $V_{21}$-$V_{24}$, and $V_{31}$-$V_{34}$ are associated with columns 1, 2 and 3, respectively. A second three-state programmable interconnect element may be placed at each intersection of a wiring track ($H_{xx}$ or $V_{xx}$), but as will be disclosed herein, some intersections may be deliberately left unpopulated.

Since horizontal and vertical wiring tracks are on different conductive layers which are not connected to one another, a plurality of contact-via elements for making electrical connections between the two conductive layers may be provided in selected places in the matrix. The interconnection matrix of the present invention employs at least two types of such contact-via elements.

Obviously, each pad-stub which is connected to both a vertical and a horizontal stub conductor has a first type of contact-via element placed underneath its input-/output pad, to form the electrical connections to the stub conductors. More precisely, two contact-via elements are placed underneath the pad, one to connect the pad to the top layer conductor, and one to connect the top layer conductor to the bottom layer conductor. The contact-via elements connecting the conductor to the pad are not shown in the figures.

A second type of contact-via element is used to make selective connections between conductors, including pad-stub conductors and conductive tracks, in the array matrix. The contact-via elements connecting the various conductors in the array matrix are referred to subsequently herein as "contact-via elements" and numerous contact-via elements are illustrated in FIG. 7 and the subsequent figures by the symbol "X".

In the detail of the matrix depicted in FIG. 7, the first track in each row or column is connected by a contact-via element to a conductor connected to the first pad to its top or right, respectively, through a two-state programmable interconnect element (e.g. track $H_{A1}$ is connected to pad A2 through a two-state programmable interconnect element and track $V_{11}$ is connected to pad B2 through a two-state programmable interconnect element). The second pad then connects to the second track (e g. track $H_{A2}$ is connected to pad A4 through a two-second state programmable interconnect element and track $V_{12}$ is connected to pad D2 through a two-state programmable interconnect element) and so forth. Those of ordinary skill in the art will appreciate that other patterns are also possible.

From an examination of FIG. 7, it will be noted that not all intersections of horizontal and vertical tracks are populated by second three-state programmable interconnect elements. Intersections at which tracks tied to stubs by contact-via element contacts meet are unpopulated since a conflict may arise during programming. For example, a voltage applied between pads C2 and C3 would appear not only across the second three-state programmable interconnect element connected between these pads, but would also appear across the intersection of tracks $V_{21}$ and $H_{C1}$. No second three-state programmable interconnect element is placed at this intersection, to avoid any ambiguity during programming as to which element is to be programmed. Alternatively, the intersection of tracks $V_{21}$ and $H_{C1}$ could have been populated with a second three-state programmable interconnect element, and the first three-state programmable interconnect element to the right of pad C2 could have been omitted.

FIG. 7 illustrates an embodiment where not all intersecting tracks are populated with second three-state programmable interconnect elements. Those of ordinary skill in the art will recognize that embodiments of the present invention are possible wherein some other degree of population of both first and second three-state programmable interconnect elements between, for example, pad stubs and other conductors is also feasible for reasons other than avoiding programming ambiguity and conflicts, such as to improve device yield and/or electrical performance, to achieve area reduction, etc.

The architecture depicted herein in FIGS. 6 and 7 may be programmed by the multipath programming scheme disclosed with reference to FIGS. 2a-2c and 3a-3b. For ex easily envisioned that pad A2 in FIG. 7 could represent pad 20 from FIG. 2. Similarly pad C3 in FIG. 7 could represent pad 22 from FIG. 2. Hence, by following the tracks to which these two pads connect by means of the contact-via element connection, namely tracks $H_{A1}$ and $V_{22}$, the second three-state programmable interconnect element at the intersection then correspondents with element 34 from FIG. 2.

Similarly it will be appreciated by those of ordinary skill in the art that, in the same manner, the programming sequence from FIGS. 4 and 5 can be mapped into the matrix depicted in FIG. 7. FIGS. 4 and 5 include two-state programmable interconnect elements shown as part of tracks 154 and 214. Several are shown in FIG. 7. It is obvious that such elements can be inserted at various places in the array depicted in FIG. 7, in order to provide a segmentation scheme. For example, placing a two-state programmable interconnect element on track $H_{A1}$ between track $V_{24}$ and pad-stub $S_{B3Y}$ would provide a two part segmentation for track $H_{A1}$, as is shown in FIG. 7.

Although FIG. 7 depicts a sufficient architecture to implement a programmable interconnect scheme using the elements as previously described herein, according to the present invention, two additional types of tracks may be employed to enhance the functionality of such a scheme. The layout of such tracks is illustrated in FIGS. 8 and 9.

Figure 8:
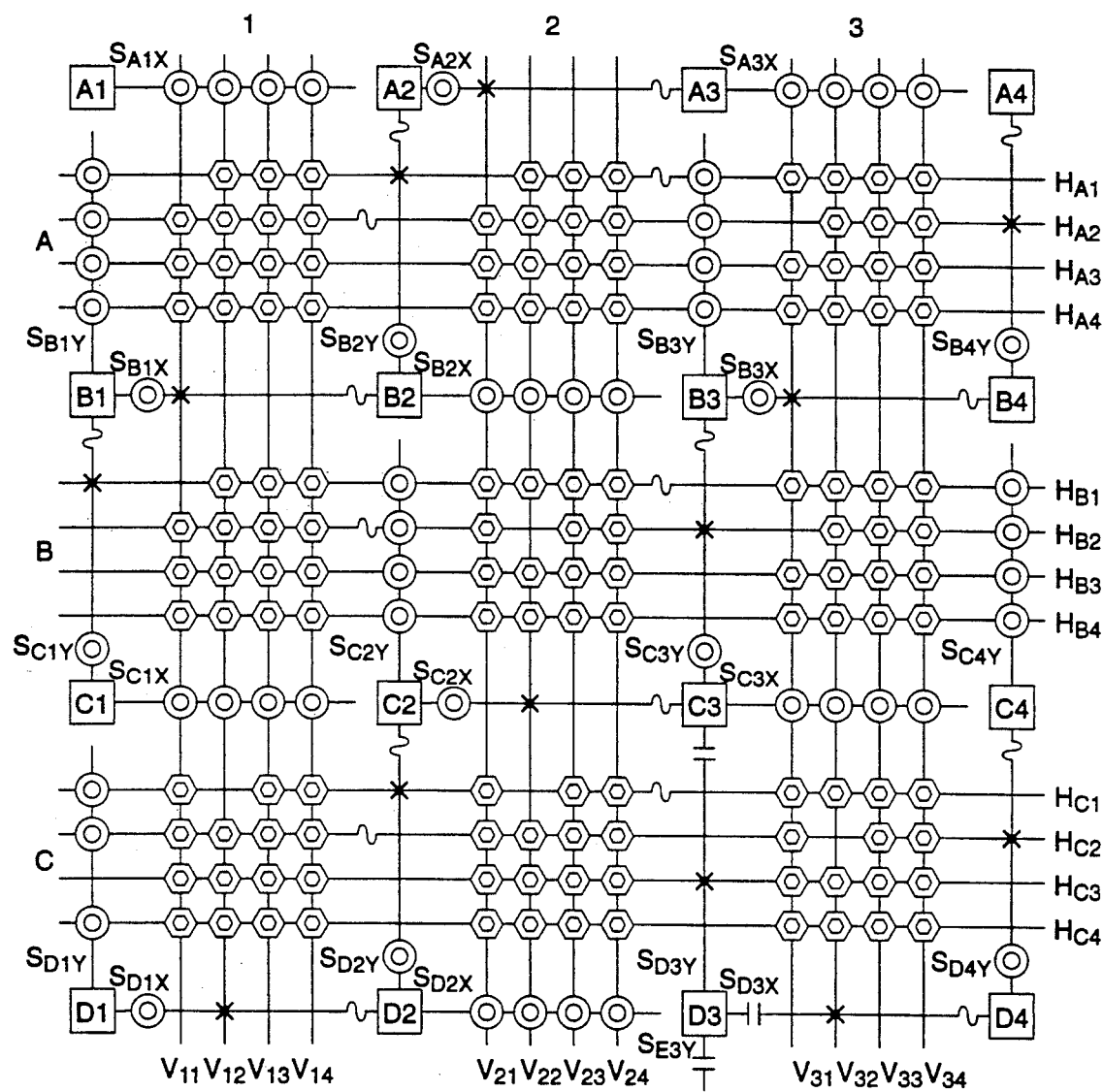
FIG. 8 is a schematic diagram of the matrix of FIG. 7 further including assist rail tracks.

Referring first to FIG. 8, and comparing FIG. 8 with FIG. 7, it may be seen that pad D3 has been disconnected from its pad-stub $S_{D3X}$, and also from its pad-stub $S_{E3Y}$ (partially shown). Where, in the embodiment of FIG. 7, the pad-stub $S_{D3X}$ of pad D3 was populated by second three-state programmable interconnect elements, the embodiment of FIG. 8 includes instead a hard-connection from pad D3 to track $H_{C3}$ through a contact-via element. Pad-stub $S_{D3Y}$ no longer connects to pad C3. With these changes pad D3 is permanently attached to track $H_{C3}$.

From a comparison of FIGS. 7 and 8 it may also be observed that track $H_{C3}$ has also been changed in three ways. First, none of the first three-state programmable interconnect elements exist on this track. Second, the track cannot be segmentable, thus none of the two-state programmable interconnect elements exist on this track. Third, all of the intersections which this track makes with other tracks are fully populated with second three-state programmable interconnect elements. Track $H_{C3}$ may be referred to as an "Assist Rail" and its use and function will be further described herein. In the illustrative embodiment of the architecture depicted in FIG. 8, assist rails only appear in the horizontal direction, not in the vertical direction, although they can be used in both directions.

Figure 9:
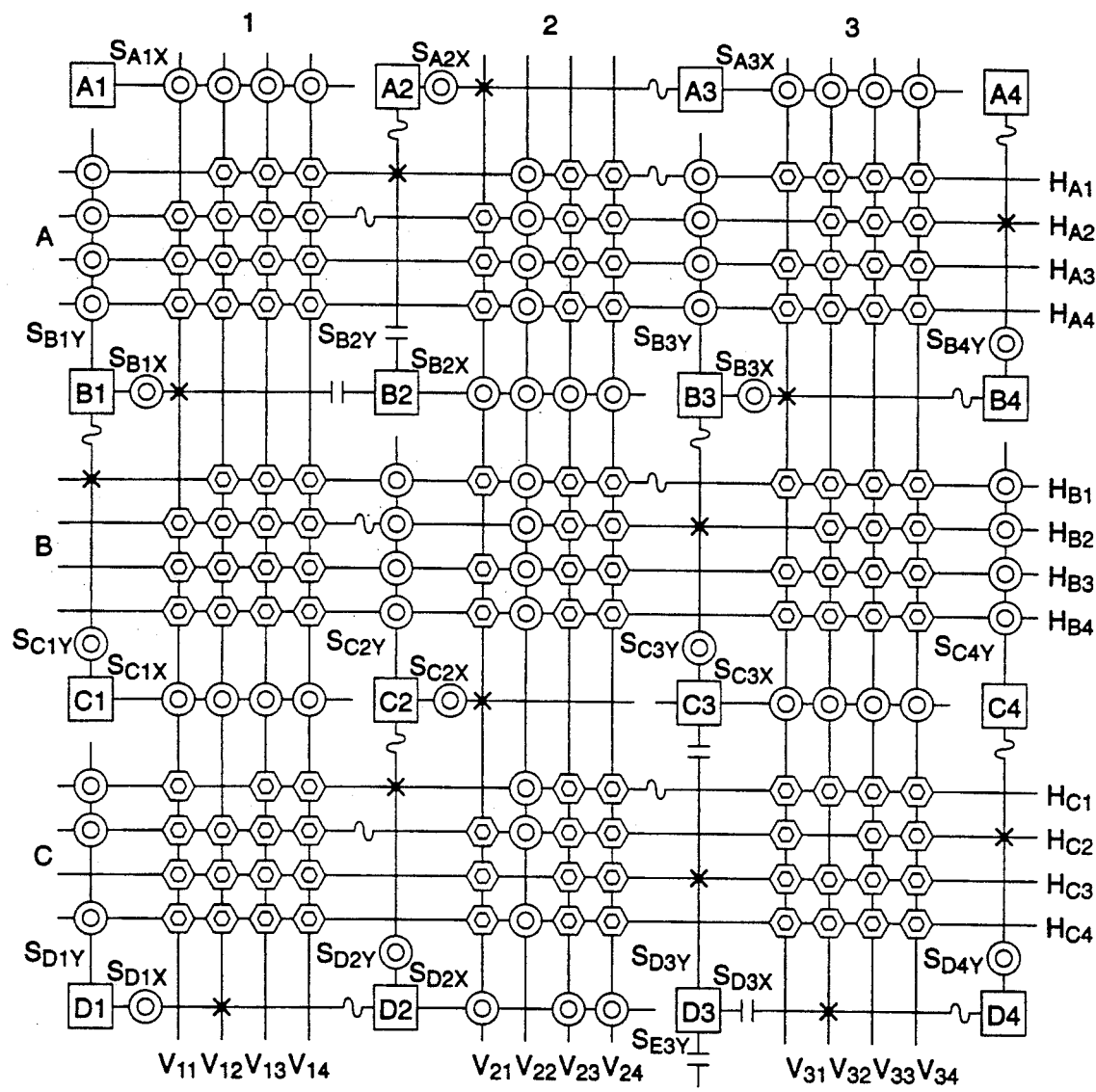
FIG. 9 is a schematic diagram of a portion of the matrix of FIG. 8 further including unused segment rails.

Referring now to FIG. 9, the layout of another type of track, which may be referred to as an "unused segment rail" is illustrated. As may be seen from a comparison of FIG. 9 with FIG. 7, track $V_{22}$ has been converted to an unused segment rail by disconnecting pad B2 from pad-stubs $S_{B2Y}$ and $S_{B1X}$, and then using contact-via element to permanently connect pad B2 to track $V_{22}$. Pad-stub $S_{B1X}$ includes no first three-state programmable interconnect elements. Further, no first three-state programmable interconnect elements exist at intersections of track $V_{22}$ with pad-stubs, such as on pad-stub $S_{D2X}$. Furthermore, all intersections of track $V_{22}$ with programming Rails, such as $H_{C3}$ are also not populated. All intersections with regular tracks that intersect with track $V_{22}$ are populated with first three-state programmable interconnect elements.

According to the illustrative embodiment of the invention depicted in FIG. 9, all tracks which are not either an assist rail or an unused segment rail are connected to exactly one pad through a contact-via element and a two-state programmable interconnect element. All other pads are connected to tracks either though a first three-state programmable interconnect element, such as pad B3, and track $H_{A2}$, or through a contact-via element and a first three-state programmable interconnect element in series with it, such as pad B4 and track $H_{A2}$. These pads, such as pad D2, associated with track $V_{12}$, are referred to as "driver pads".

Note that, except for where programming rails or unused segment rails are concerned, because of the limitation above, and because of the pad-stubs forming alternating patterns, no more tracks can exist in a row or column than the number of pad-stubs the row or column intersects, divided by 2, for an even number of pad stubs.

Two-state programmable interconnect elements may be disposed along the tracks and are used for segmentation. The segmentation scheme has to be chosen such that sufficient tracks intersect the segment to allow programming (as defined by the p and q relation defined in equation 11). It is optimal, but not required, that each segment have at least the unused segment rail intersecting it.

The manner in which the interconnect elements are programmed to form the interconnect patterns, or nets will now be disclosed in detail. According to a presently preferred embodiment of the present invention, all interconnect elements will be either in a programmed conductive state, or a programmed nonconductive state when programming has been completed. No programmable interconnect element will be left at the un-programmed non-conductive state.

As an example of the programming of horizontal segments, attention is drawn to track $H_{C1}$ in FIG. 9. C2 is the driver pad for this track. The first segment on this track continues from its left edge to the left end of the two-state programmable interconnect element located to the right of track $V_{24}$. The next segment starts with the right-hand end of the two-state programmable interconnect element located to the right of track $V_{24}$. By applying $V_{pp}$ between pads C2 and D1 the first three-state programmable interconnect element at the intersection of pad-stub $S_{D1Y}$ and track $H_{C1}$ is programmed from its unprogrammed non-conductive state to its first programmed conductive state.

Figure 10:
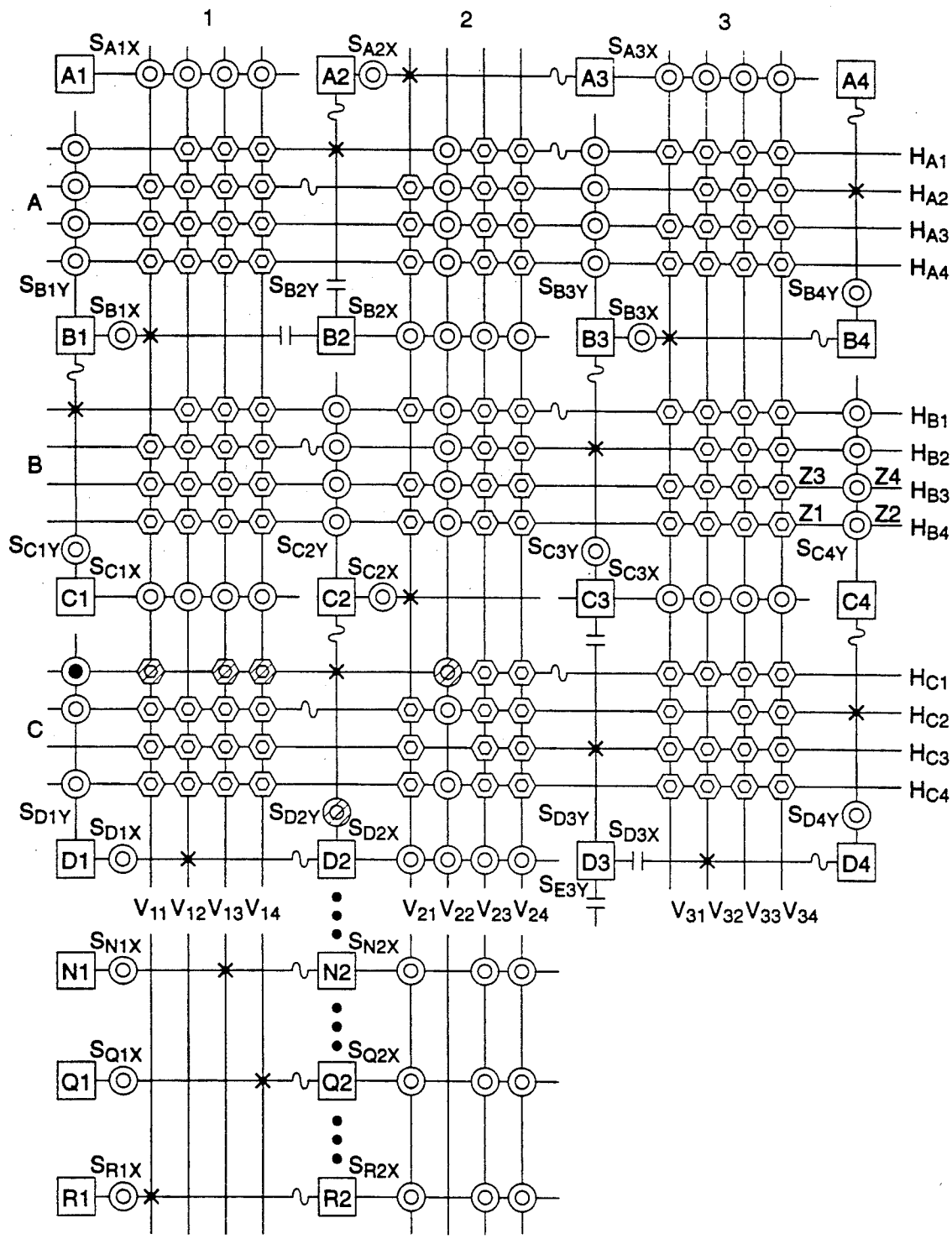
FIG. 10 is a schematic diagram of a portion of the matrix of FIG. 9 further showing additional pads, conductors and programmable elements to illustrate multi-path programming.

Referring now to FIG. 10, to program the first three-state programmable interconnect element at the intersection of pad-stub $S_{D1Y}$ and track $H_{C1}$ into its second non-conductive state, the current sharing method explained in FIG. 4 is employed. This may be achieved by obtaining a sufficient amount of tracks q, to satisfy equation 11. In this case, tracks $V_{11}$, $V_{13}$ and $V_{14}$, which have driver pads N2, Q2, and R2 are chosen. If more than three driver pads are needed, tracks from $V_{21}$-$V_{24}$ would not be used as this would cause a conflict with the first three-state programmable interconnect elements on pads-stubs $S_{N2X}$, $S_{Q2X}$ and $S_{R2X}$, which would be programmed in parallel with the second three-state programmable interconnect elements at the intersection of tracks $V_{21}$-$V_{24}$ and track $H_{C1}$. Instead, the tracks from the next row or column would be used. (In this case tracks $V_{31}$-$V_{34}$ do not qualify, since they are in the next segment on track $H_{C1}$, and tracks to the left of $V_{11}$ need to be used).

If it is assumed that q=3, then equation 11 is satisfied after tracks $V_{11}$, $V_{13}$ and $V_{14}$ have been connected to track $H_{C1}$ by voltage programming the second three-state programmable interconnect elements to their first programmed state. By supplying current $I_{b\text{-}sustain}$ through each of driver pads N2, Q2 and R2, and by supplying current $I_{B\text{-}sustain}$ through driver pad C2, the current $I_{B\text{-}open}$ is created inside the first segment on track $H_{C1}$. This current is sinked on pad C1, which then results in programming first three-state programmable interconnect element from the programmed conductive to the programmed non-conductive state. Pad D1 is then no longer connected to track $H_{C1}$.

At this point pad D2 can be connected to track $H_{C1}$ by applying the programming voltage $V_{pp}$ between pad D2 and all of the pads C2, N2, Q2 and R2. Pad D2 cannot be connected to track $H_{C1}$ if pad D1 is still connected, since the first three-state programmable interconnect element on pad-stub $S_{D1X}$ would be in parallel. This can easily be avoided by taking care in determining the programming sequence. Program sequence determination is architecture dependent and is well within the level of ordinary skill in the art.

FIG. 10 shows the situation just described, with pads C2, D2, N2, Q2 and R2 all connected to track $H_{C1}$. Furthermore, it also shows that pad B2 is connected to track $H_{C1}$. This can be done by applying $V_{pp}$ between pad B2 and the conglomerate of pads connected to track $H_{C1}$.

Track $V_{22}$ has been referred to as the unused segment track, By supplying current $I_{B\text{-}sustain}$ through pad B2, and current $I_{b\text{-}sustain}$ through pads N2, Q2, and R2, all first three-state programmable interconnect elements that intersect with the first segment on track $H_{C1}$ can be sequentially pr grammed to the non-conductive state, as well as the two-state programmable interconnect element that connected to driver pad C2. The nature of the programming sequence requires that each sequence ends with a current path through two-state programmable interconnect element or first three-state programmable interconnect element to allow programming of second three-state programmable interconnect element 14 to a non-conductive state.

Thus there always remains a two-state programmable interconnect element and a first three-state programmable interconnect element in the conductive state connected to each segment after programming. Note that this could be the segmentation fuse itself, which is suboptimal. By introducing the unused segment track $V_{22}$, and asserting that each segment is intersected by such a track, it may be seen that in the case in which segment is unused, it remains attached to the unused segment track after programming, and not to a net. This improves the electrical performance of the interconnect after programming because of reduction of capacitances.

By supplying $I_{B\text{-}sustain}$ ($\leq I_{b\text{-}open}$) the second three-state programmable interconnect elements that connect to the first segment on track $H_{C1}$ can be programmed to the non-conductive state, one at a time, and the programming sequence is completed for the first part. It may now be understood that the other second three-state programmable interconnect elements on tracks $V_{21}$-$V_{24}$ are then also programmed in successive voltage and current programming sequences.

First three-state programmable interconnect elements that are needed in the interconnect are left in the conductive state, and similar to how unused segment track $V_{22}$ can remain attached to the segment, so can each of the pads that has a first three-state programmable interconnect element on the pad-stub where it intersects with track $V_{22}$. This pad now becomes the new driver pad, as the original driver pad may no longer be attached to the segment. Only one pad remains attached to rhe segment. If more than one pad is to remain attached, the other pads are not programmed yet. Programming is postponed unto the final programming phase. Programming of all second three-state programmable interconnect elements that are to be programmed into the conductive state only, is also postponed until the final programming phase.

Some care needs to be taken when programming tracks further 10 along, as each of the elements of whom programming was postponed until the final phase can cause interference with the programming of another track. As an example, in FIG. 10 the second three-state programmable interconnect elements at the intersections of tracks $V_{34}$ and $H_{B3}$ and $H_{B4}$ were named Z1 and Z3, respectively, and the first three-state programmable interconnect elements at the intersection of pad-stub $S_{C4Y}$ and tracks $H_{B3}$ and $H_{B4}$ were named Z2 and Z4 respectively.

If, because of interconnect patterns, both Z1 and Z2 are included in a net then, after programming track $H_{B4}$, Z2 would be programmed into a conductive state, and Z1 would still be in its initial, non-conductive state. If element Z3 was the next element to be programmed into a conductive state, elements Z1 and Z4, both in their initial state, now appear in parallel, and Voltage Programming cannot take place until element Z3 is disconnected again. Therefore track $V_{34}$ cannot be used in assisting the current sharing.

Similarly, if element Z4 is to be programmed first, elements Z1 and Z3 appear in parallel, and voltage programming of element Z3 cannot take place. Either element Z3 or Z4 has to be programmed into the non-conductive state before the programming can continue. Many more such and more complicated problems exist with this scheme, but all of them can be worked out into a set of solvable constraints, which then are solved in either the interconnect routing and in the interconnect programming schemes.

With the layout orientation of FIG. 10, programming of the horizontal tracks has to be done in a bottom to top manner, and programming of the vertical tracks in a left to right manner. This is dictated by the direction in which the driver pads connect to the tracks, which is to the left for vertical tracks, and to the bottom for horizontal tracks. Changing these directions changes the track programming sequence.

The architecture can be used to program either the vertical tracks first, or the horizontal tracks first. In the description presented herein, the horizontal tracks are programmed first. At the end of programming all horizontal tracks have been segmented, by programming the two-state programmable interconnect segmentation elements on the tracks, and each segment is then associated with a pad driver, or is connected to one of the unused segment rails.

Still unprogrammed are the interconnedt elements for which programming was deferred unto the final phase, and all of the segmentation elements on vertical tracks, and the intersections of vertical tracks and pad-stubs. Programming of these tracks is done by using the assist rails. One of them is shown as track $H_{C3}$ in FIG. 10.

Programming the vertical tracks is simpler than programming the horizontal tracks, as the assist rails do not have many of the constraints that the vertical tracks caused on the programming of the horizontal tracks. Required is that a total of q of such tracks intersect each vertical segment. Then the programming succeeds by connecting all such assist rails to the segment being programmed using voltage programming. The first three-state programmable interconnect elements on the pad-stubs can be sequentially programmed to first conductive, and then non-conductive states. The last remaining first three-state programmable interconnect element is left in the conductive state, and is used to program all the second three-state programmable interconnect elements to the non-conductive state, except the ones needed for the interconnect, which are left in the first programmed conductive state. Segmentation elements are programmed at the same time. Those of ordinary skill in the art will appreciate that for segmentation elements to be programmed, a sufficient number of tracks need to be attached to the segments at either side of the segmentation fuse.

After completion of programming of the vertical tracks, an interconnect matrix exists in which all pads are connected to a segment, and the segment-segment interconnection is done by voltage programming of second three-state programmable interconnect elements which are still in their initial state. This is the final phase of programming. Once completed, all two-state and first and second three-state programmable interconnect elements that are not needed for interconnect have been programmed to a non-conductive state, whereas all two-state and first and second three-state programmable interconnect elements that are used for the interconnect have been programmed to a conductive state.

It should be noted that the matrix described herein is a general organization. In designing any particular interconnect matrix using the principles of the present invention, care must be taken such that no programming step may actually allow parallel or series programming of any of the two-state and first 14 and second three-state programmable interconnect elements used. This creates design constraints for the programming sequence determined by the particular architecture. Those of ordinary skill in the art, aware of these constraints can quickly assess which kind of constraints are involved and how to adapt both the programming sequence and the architecture described herein to an actual embodiment.

An alternative way of programming the above-described architecture would be to program only the fuses which are needed for interconnect and leaving unprogrammed the unneeded elements. In such a case, the three-state elements may be replaced by two-state normally open antifuse elements.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated, user-programmable interconnect architecture comprising:
   a plurality of input/output pads through which programming signals may be transmitted to the interconnect architecture;
   first conductors consisting of a plurality of electrically conductive tracks;
   second conductors consisting of a plurality of electrically conductive tracks;
   intersections formed where ones of said first conductors intersect with ones of said second conductors;
   a plurality of passive electrically-programmable first three-state interconnection elements responsive to said programming signals; each of said three-state interconnection elements located at one of said intersections; and
   first passive means for selectively programming said first three-state interconnection elements.

2. The integrated, user-programmable interconnect architecture of claim 1 further comprising:
   at least one pad stub associated with each of said input/output pads, said pad stubs providing electrical connection between said input/output pads and said first and second conductors.

3. The integrated, user-programmable interconnect architecture of claim 2 further comprising:
   contact via elements providing electrical connection between selected ones of said first conductors and selected ones of said second conductors.

4. The integrated, user-programmable interconnect architecture of claim 3 further comprising:
   at least one two-state interconnection element disposed between one of said input/output pads and an adjacent pad stub; and
   second passive means for selectively programming said two-state interconnection element.

5. The integrated, user-programmable interconnect architecture of claim 3 further comprising:
   at least one second three-state interconnection element disposed between one of said input/output pads and an adjacent pad stub; and
   second passive means for selectively programming said second three-state interconnection element.

6. The integrated, user-programmable interconnect architecture of claim 4 further comprising:
   at least one second three-state interconnection element disposed between one of said input/output pads and an adjacent pad stub; and
   third passive means for selectively programming said second three-state interconnection element.

7. The integrated, user-programmable interconnect architecture of claim 6 wherein:
   at least one of said first three state interconnection elements is of the normally open type.

8. The integrated, user-programmable interconnect architecture of claim 7 wherein:
   at least one of the others of said first three state interconnection elements is of the normally closed type.

9. The integrated, user-programmable interconnect architecture of claim 8 wherein:
   at least one of the others of said second three state interconnection elements is of the normally closed type.

10. The integrated, user-programmable interconnect architecture of claim 9 wherein:
    at least one of the others of said second three state interconnection elements is of the normally open type.

11. The integrated, user-programmable interconnect architecture of claim 1 wherein:
    at least one of said first conductors includes at least one two-state interconnection element, the user-programmable interconnect architecture further comprising second passive means for selectively programming said two-state interconnection element of said first conductors.

12. The integrated, user-programmable interconnect architecture comprising:
    a plurality of two-state interconnection elements, each of said two-state interconnection elements being irreversibly switchable from said first essentially short-circuit state to a second essentially open-circuit state by passing a predetermined electrical current having a first magnitude therethrough;
    a plurality of first three-state interconnection elements, each of said first three-state interconnection elements being irreversibly switchable from an unprogrammed essentially non-conductive state to a first programmed essentially conductive state by placing an electrical potential having a predetermined magnitude thereacross, and being irreversibly switchable from said first programmed essentially conductive state to a second programmed essentially non-conductive state by passing a predetermined electrical current having a second magnitude therethrough;
    a plurality of second three-state interconnection elements, each of said second three-state interconnection elements being irreversibly switchable from an unprogrammed essentially non-conductive state to a first programmed essentially conductive state by placing an electrical potential having a predetermined magnitude thereacross, and being irreversibly switchable from said first programmed essentially conductive state to a second programmed essentially non-conductive state by passing a predetermined electrical current having a third magnitude therethrough;
    a plurality of input/output pads through which programming signals may be transmitted to the interconnect architecture arranged in a matrix of rows and columns, at least one of said input/output pads connected to another one of said input/output pads by one of said two-state interconnection elements in series with one of said first three-state interconnection elements;
    a plurality of first conductors disposed in a direction substantially parallel to said rows, each of said rows having at least one of said first conductors connected through at least one of said first three-state interconnection elements to selected ones of said input/output pads associated with said rows, at least one of said first conductors including and segmentable by at least one of said two-state interconnection elements located at a selected position along its length;

a plurality of second conductors disposed in a direction substantially parallel to said columns, each of said columns having at least one of said second conductors connected through at least one of said first three-state interconnection elements to selected ones of said input/output pads associated with said columns, said second conductors forming intersections with said first conductors, at least one of said second conductors including and segmentable by at least one of said two-state interconnection elements located at a selected position along its length;

ones of said second three-state interconnection elements connected between ones of said first conductors and ones of said second conductors at selected ones of said intersections.

13. The integrated, user-programmable interconnect architecture of claim 12 further comprising:

means responsive to said programming signals for programming said two-state interconnection elements, said first three-state interconnection elements, and said second three-state interconnection elements.

* * * * *